(12) United States Patent
Takagi et al.

(10) Patent No.: US 9,418,737 B2
(45) Date of Patent: Aug. 16, 2016

(54) NONVOLATILE SEMICONDUCTOR MEMORY DEVICE AND METHOD OF CONTROLLING THE SAME

(71) Applicant: KABUSHIKI KAISHA TOSHIBA, Minato-ku (JP)

(72) Inventors: Takeshi Takagi, Yokkaichi (JP); Masaki Yamato, Yokkaichi (JP); Hiroyuki Ode, Yokkaichi (JP); Takeshi Yamaguchi, Yokkaichi (JP); Toshiharu Tanaka, Yokkaichi (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 14/813,523

(22) Filed: Jul. 30, 2015

(65) Prior Publication Data

US 2016/0189776 A1 Jun. 30, 2016

Related U.S. Application Data

(60) Provisional application No. 62/098,595, filed on Dec. 31, 2014.

(51) Int. Cl.
*G11C 11/00* (2006.01)
*G11C 13/00* (2006.01)

(52) U.S. Cl.
CPC .......... *G11C 13/0064* (2013.01); *G11C 13/004* (2013.01); *G11C 13/0007* (2013.01); *G11C 13/0069* (2013.01)

(58) Field of Classification Search
USPC ............................. 365/148, 185.22, 189.011
See application file for complete search history.

(56) References Cited

U.S. PATENT DOCUMENTS

| 2009/0303785 | A1 | 12/2009 | Hwang et al. |
| 2010/0195372 | A1 | 8/2010 | Toda |
| 2011/0128773 | A1 | 6/2011 | Azuma et al. |
| 2013/0329485 | A1* | 12/2013 | Takashima ......... G11C 13/0011 365/148 |

* cited by examiner

*Primary Examiner* — Vu Le
(74) *Attorney, Agent, or Firm* — Oblon, McClelland, Maier & Neustadt, L.L.P.

(57) ABSTRACT

A nonvolatile semiconductor memory device includes: a memory cell array; and a control circuit that controls a voltage applied to this memory cell array. The memory cell array includes: a first wiring line; a second wiring line intersecting the first wiring line; and a memory cell disposed at an intersection of these lines and including a variable resistance element. In a rewrite operation of the memory cell, the control circuit repeatedly perform a pulse application operation and a verify operation, the pulse application operation applying a pulse voltage to the memory cell, and the verify operation applying a first voltage to the memory cell to determine whether the rewrite operation has been completed or not. The control circuit is configured to, in a read operation from the memory cell, apply a second voltage to the memory cell. The second voltage has a voltage value larger than the first voltage.

13 Claims, 12 Drawing Sheets

Oxygen Defect Density Φ: Small
Number of Vo: Small

NONVOLATILE SEMICONDUCTOR MEMORY DEVICE AND METHOD OF CONTROLLING THE SAME

CROSS REFERENCE TO RELATED APPLICATIONS

This application is based on and claims the benefit of priority from prior U.S. prior provisional Patent Application No. 62/098,595, filed on Dec. 31, 2014, the entire contents of which are incorporated herein by reference.

FIELD

Embodiments described herein relate to a nonvolatile semiconductor memory device and a method of controlling the same.

BACKGROUND

Description of the Related Art

In recent years, a ReRAM (Resistive RAM) that utilizes as a memory a variable resistance element whose resistance value is reversibly changed, has been proposed. In such a nonvolatile semiconductor memory device, enlargement of capacity and raising of integration level have been proceeding. In such a nonvolatile semiconductor memory device, a setting operation that lowers a resistance value of a memory cell causes the resistance value of the memory cell to be lowered (set state), and a resetting operation that increases the resistance value of the memory cell causes the resistance value of the memory cell to be increased (reset state). At this time, it is required that a sufficient read margin is secured between the memory cell in the set state and the memory cell in the reset state.

DETAILED DESCRIPTION

A nonvolatile semiconductor memory device according to an embodiment includes: a memory cell array; and a control circuit that controls a voltage applied to the memory cell array. The memory cell array includes: a first wiring line; a second wiring line that intersects the first wiring line; and a memory cell disposed at an intersection of the first and second wiring lines and including a variable resistance element. In a write operation from the memory cell, the control circuit repeats a write pulse application operation and a verify read operation, the write pulse application operation applying a write pulse voltage to the memory cell, and the verify read operation applying a first voltage to the memory cell to determine whether the write operation has been completed or not. In a read operation from the memory cell, the control circuit applies a second voltage to the memory cell. The second voltage has a voltage value which is larger than that of the first voltage.

Embodiments of a nonvolatile semiconductor memory device and a method of controlling the same will be described below with reference to the drawings.

First Embodiment

[Configuration]

Figure 1:
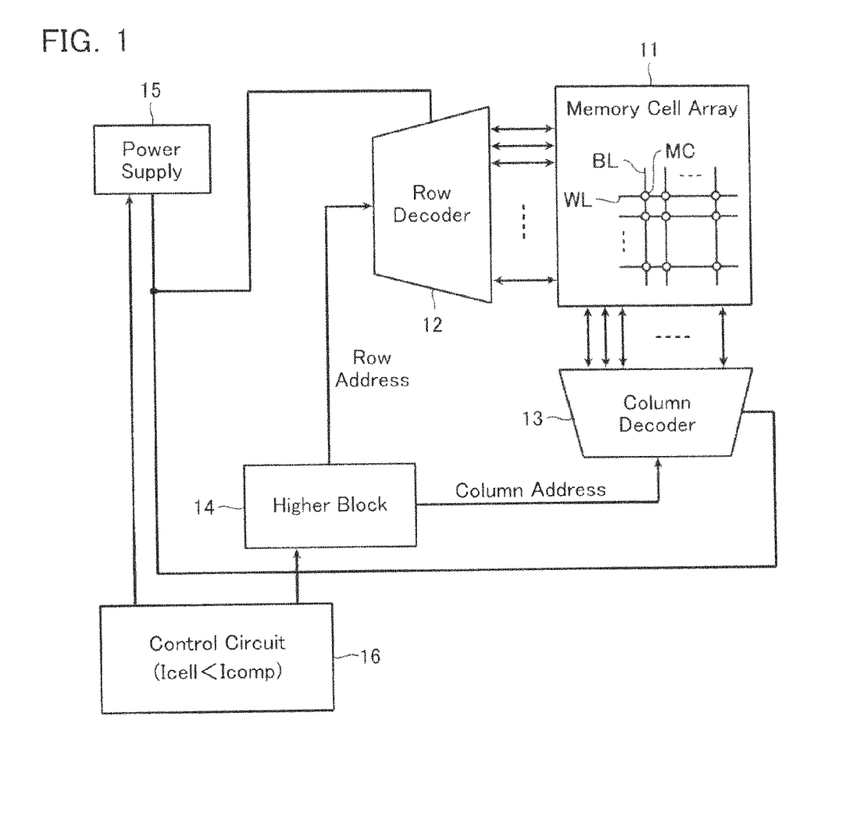
FIG. 1 is an example of a block diagram of a semiconductor memory device according to a first embodiment.

First, an overall configuration of a semiconductor memory device according to a first embodiment will be described. FIG. 1 is an example of a block diagram of the semiconductor memory device according to the first embodiment. As shown in FIG. 1, the semiconductor memory device includes a memory cell array 11, a row decoder 12, a column decoder 13, a higher block 14, a power supply 15, and a control circuit 16.

The memory cell array 11 includes a plurality of word lines WL and bit lines BL that intersect each other, and a memory cell MC disposed at each of intersections of these word lines WL and bit lines BL. The row decoder 12 selects the word line WL during access (write/read). The column decoder 13 selects the bit line BL during access and includes a driver that controls an access operation.

The higher block 14 selects the memory cell MC that is to be an access target in the memory cell array 11. The higher block 14 respectively provides a row address and a column address to the row decoder 12 and the column decoder 13. The power supply 15 generates certain combinations of voltages corresponding to each of operations of data erase/write/read, and supplies these combinations of voltages to the row decoder 12 and the column decoder 13.

The control circuit 16 performs control of sending addresses to the higher block 14, and so on, and, in addition, performs control of the power supply 15, based on a command from external. Moreover, the control circuit 16 controls voltage values, and so on, such that when performing a write operation in the likes of a setting operation or a resetting operation, a current (hereafter, called "cell current") Icell flowing in the memory cell MC is smaller than a compliance current Icomp. Note that the control circuit 16 comprises the likes of an ECC circuit that performs error detection/correction of data read from the memory cell array 11.

[Memory Cell and Memory Cell Array]

Figure 2:
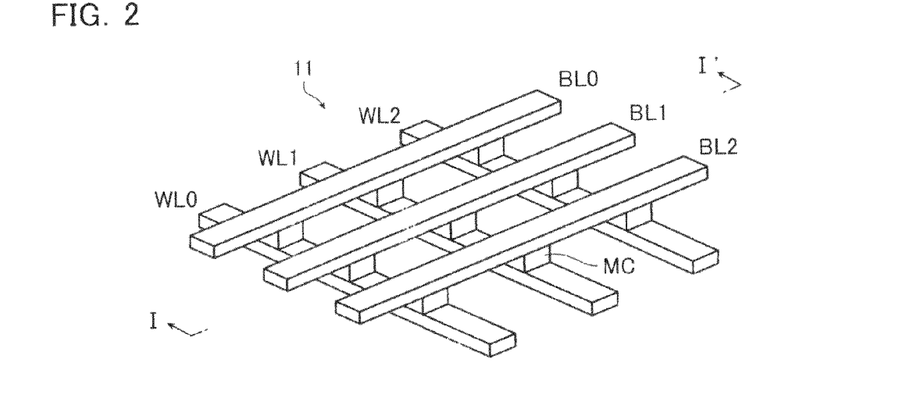
FIG. 2 is a perspective view of part of the same memory cell array 11.
Figure 3:
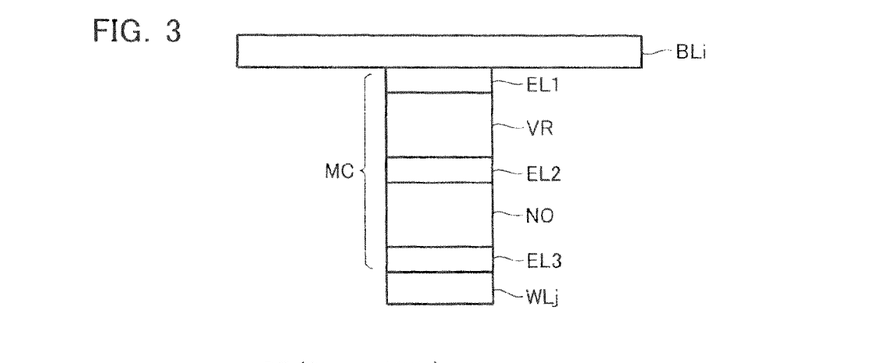
FIG. 3 is a cross-sectional view of a single memory cell portion, taken along the line I-I' and looking in the direction of the arrows in FIG. 2.

FIG. 2 is a perspective view of part of the memory cell array 11; and FIG. 3 is a cross-sectional view of a single memory cell portion, taken along the line I-I' and looking in the direction of the arrows in FIG. 2.

Word lines WL0 to WL2 acting as a plurality of first wiring lines are arranged in parallel, bit lines BL0 to BL2 acting as a plurality of second wiring lines are arranged in parallel intersecting these word lines WL0 to WL2, and the memory cell MC is disposed at each of intersections of these word lines WL0 to WL2 and bit lines BL0 to BL2 so as to be sandwiched by both wiring lines. The word line WL and the bit line BL are desirably of a material which is heat-resistant and has a low resistance value.

As shown in FIG. 3, the memory cell MC is a bipolar type memory cell configured from a series-connected circuit of a variable resistance element VR and a non-ohmic element NO. The variable resistance element VR stores its resistance value as rewritable data in a nonvolatile manner. In addition, the non-ohmic element NO is, for example, a non-ohmic element such as a diode or a transistor. Moreover, the bit line BL, the variable resistance element VR, the non-ohmic element NO, and the word line WL are connected by electrodes EL1, EL2, and EL3 respectively interposed therebetween. These electrodes EL1, EL2, and EL3 function as a barrier metal and an adhesive layer. Note that it is also possible to insert in the variable resistance element VR another layer, such as a separate buffer layer, barrier metal layer, and adhesive layer. Moreover, the memory cell MC may adopt a unipolar type memory cell.

[Variable Resistance Element VR]

Figure 4:
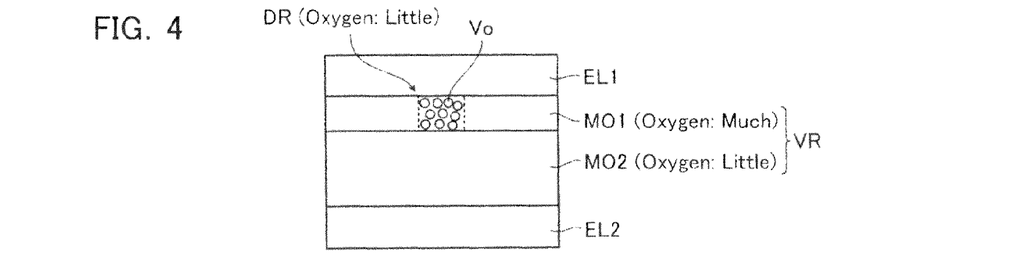
FIG. 4 is a schematic cross-sectional view of a variable resistance element VR.

Next, a configuration example of the variable resistance element VR will be described with reference to FIG. 4. FIG. 4 is a schematic cross-sectional view showing the configuration example of the variable resistance element VR. As shown in FIG. 4, as an example, the variable resistance element VR according to the present embodiment comprises, stacked therein, a first metal oxide layer MO1 and a second metal oxide layer MO2.

The first metal oxide layer MO1 and the second metal oxide layer MO2 are both configured from a metal oxide, but percentage content of oxygen is higher in the first metal oxide layer MO1 than in the second metal oxide layer MO2. Therefore, resistivity in the first metal oxide layer MO1 is basically higher than resistivity in the second metal oxide layer MO2.

Moreover, as shown in FIG. 4, a low-resistance defect region DR where percentage content of oxygen is low is formed in the first metal oxide layer MO1. The defect region DR includes a plurality of oxygen defects Vo.

Note that the variable resistance element VR according to the present embodiment comprises, stacked therein, the first metal oxide layer MO1 and the second metal oxide layer MO2, but the variable resistance element VR need only include a metal oxide, and it is also possible for another configuration to be adopted.

Figure 5A:
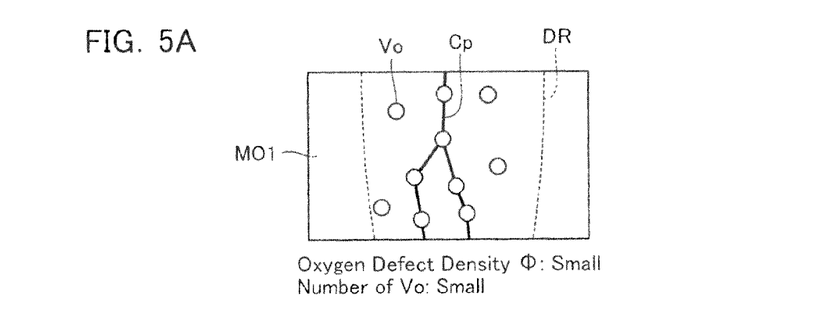
FIGS. 5A and 5B are schematic cross-sectional views of the variable resistance element VR.
Figure 5B:
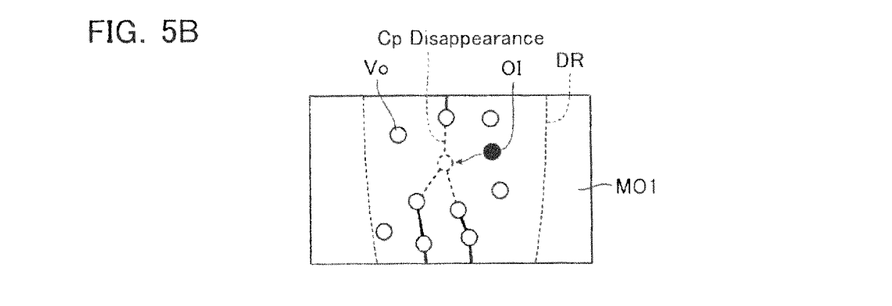

Next, the defect region DR will be described with reference to FIGS. 5A and 5B. FIGS. 5A and 5B are schematic cross-sectional views of the defect region DR.

As shown in FIG. 5A, the defect region DR in the first metal oxide layer MO1 includes a plurality of oxygen defects Vo. Moreover, formed between oxygen defects Vo in close proximity is a current path Cp (filament path). Therefore, when an upper surface and a lower surface of the first metal oxide layer MO1 are connected by a plurality of the current paths Cp, these plurality of current paths Cp function as conductive filaments, and a resistance value of the memory cell MC lowers.

Now, as shown in FIG. 5B, sometimes, an oxygen defect Vo disappears due to recombination with an oxygen ion OI, and so on. In this case, current paths Cp in a periphery of the disappeared oxygen defect Vo also disappear. In this case, part of the filament gets severed, hence the resistance value of the memory cell MC increases. This phenomenon results in the resistance value of the memory cell MC fluctuating in a certain range.

Note that sometimes, a magnitude of a range in which the defect region DR is formed differs between the plurality of memory cells in one memory cell array according to a distance from the row decoder 12 or the column decoder 13 of the memory cell MC, for example. The defect region DR is formed by a forming operation that applies a voltage to the variable resistance element VR, after manufacturing of the memory cell MC. At this time, if the distance from the row decoder 12 is far, a voltage drop in the word line WL increases. Similarly, if the distance from the column decoder 13 is far, a voltage drop in the bit line BL increases. As a result, a voltage applied to the memory cell MC during the forming operation ends up decreasing, whereby the defect region DR ends up being formed in a comparatively wide range. Therefore, sometimes, when the memory cell array 11 becomes large-scale, such a difference in magnitude of the defect region DR increases between the plurality of memory cells MC.

[Operation of Variable Resistance Element VR]

Figure 6A:
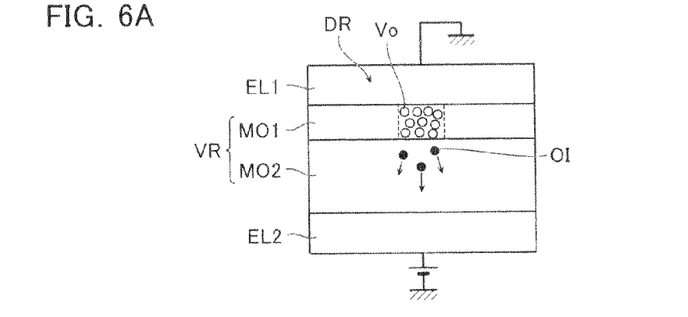
FIGS. 6A to 6C are schematic views for explaining operation of the variable resistance element VR.
Figure 6B:
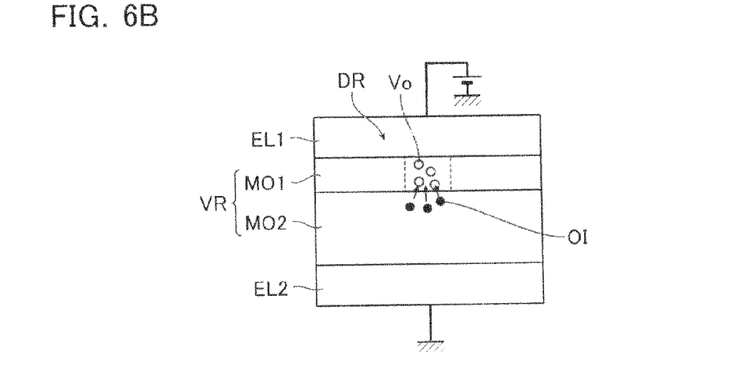

Next, operation of the variable resistance element VR will be described with reference to FIGS. 6A and 6B. FIGS. 6A and 6B are schematic cross-sectional views for explaining operation of the variable resistance element VR.

FIG. 6A shows an operation (setting operation) that sets the electrode EL2 to a high potential and the electrode EL1 to a low potential, and thereby changes the resistance value of the variable resistance element VR from a high-resistance state (reset state) to a low-resistance state (set state). In this case, oxygen ions OI in the defect region DR migrate to the second metal oxide layer MO2 whereby oxygen defects Vo are newly generated in the defect region DR and the resistance value of the defect region DR decreases.

On the other hand, FIG. 6B shows an operation (resetting operation) that sets the electrode EL1 to a high potential and the electrode EL2 to a low potential, and thereby changes the resistance value of the variable resistance element VR from the low-resistance state (set state) to the high-resistance state (reset state). In this case, oxygen ions OI in the second metal oxide layer MO2 migrate to the defect region DR whereby oxygen defects Vo in the defect region DR disappear and the resistance value of the defect region DR increases. Note that in the description below, a direction of application of a voltage such that an electrode EL2 side is high potential and an electrode EL1 side is low potential as shown in FIG. 6A is assumed to be a positive direction of a voltage. Similarly, a direction of application of a voltage such that the electrode EL1 side is high potential and the electrode EL2 side is low potential as shown in FIG. 6B is assumed to be a negative direction of a voltage.

In the case where a comparatively large number of oxygen defects Vo exists, there also exists a comparatively large number of current paths Cp. Therefore, the number of filaments connecting the upper surface and the lower surface of the first metal oxide layer MO1 also becomes comparatively large and the resistance value of the memory cell MC lowers. On the other hand, in the case where only a comparatively small number of oxygen defects Vo exists, there also exists only a comparatively small number of current paths Cp. Therefore, the number of filaments connecting the upper surface and the lower surface of the first metal oxide layer MO1 also becomes comparatively small and the resistance value of the memory cell MC rises.

Figure 6C:
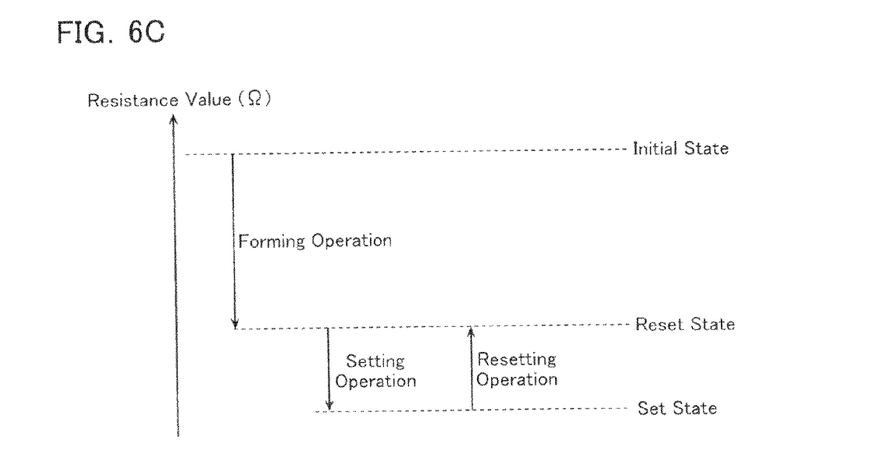
Figure 7A:
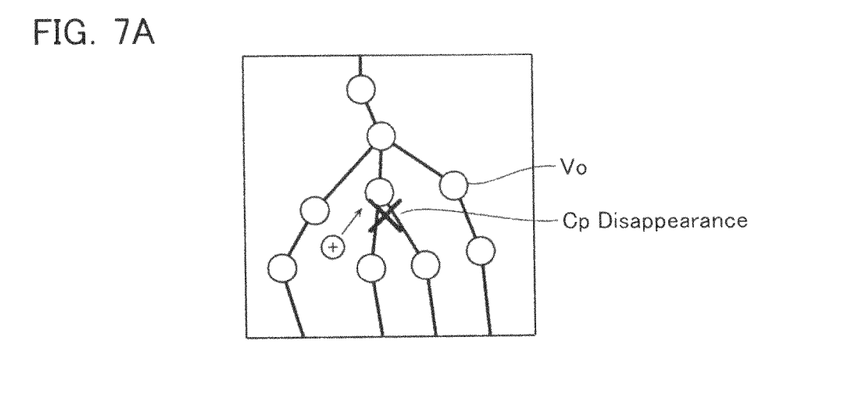
FIGS. 7A to 7D are schematic views for explaining change in resistance value of the variable resistance element VR due to an effect of a charge.
Figure 7B:
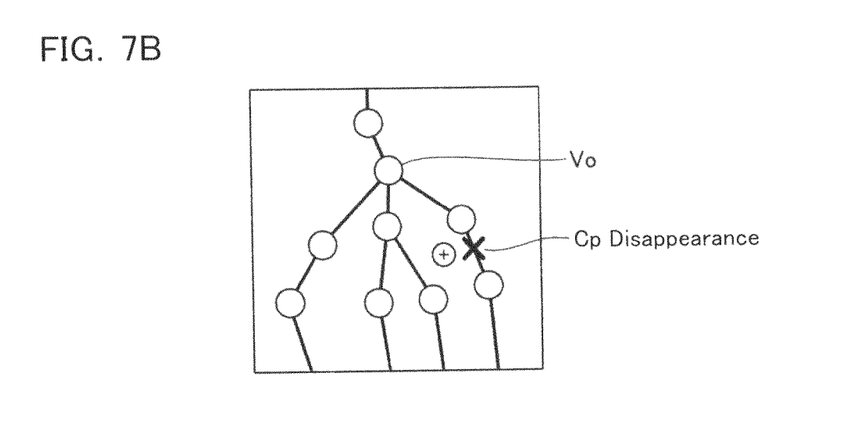
Figure 7C:
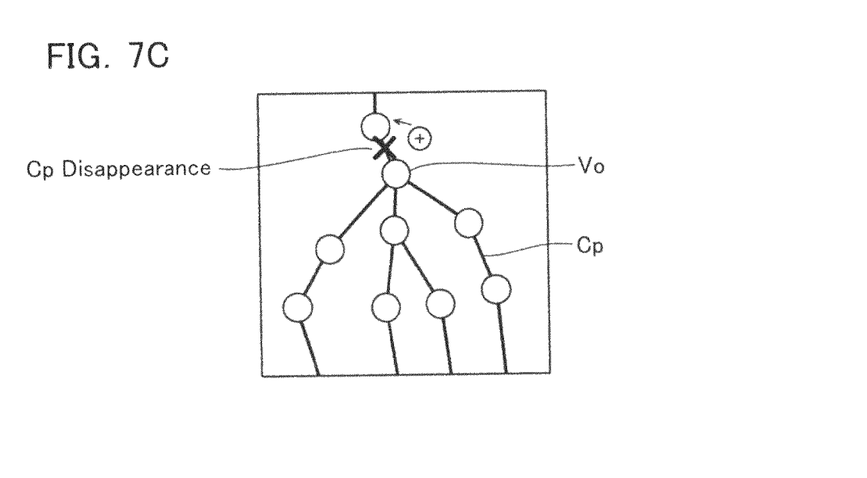
Figure 7D:
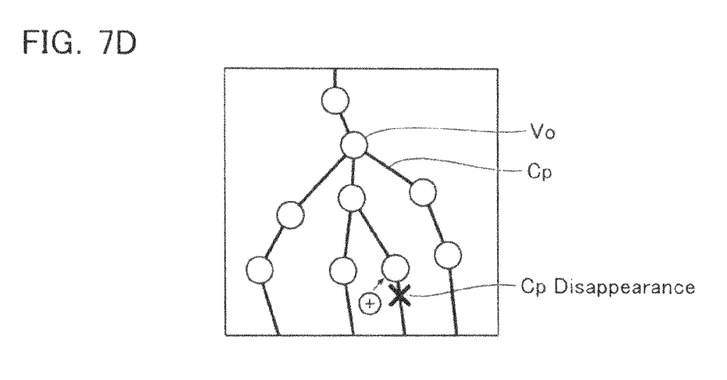
Figure 8A:
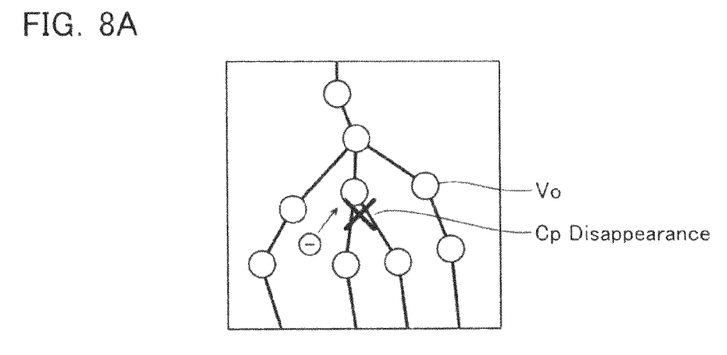
FIGS. 8A to 8D are schematic views for explaining change in resistance value of the variable resistance element VR due to an effect of a charge.
Figure 8B:
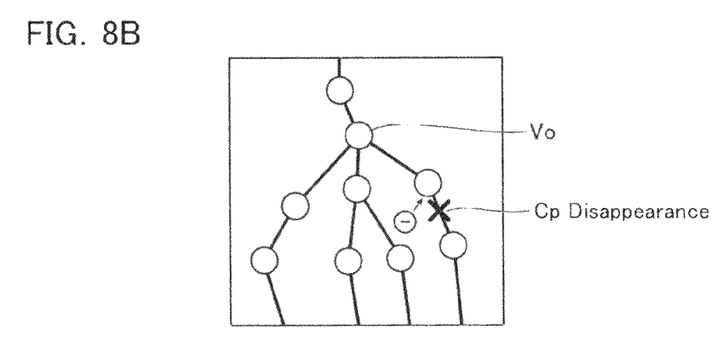
Figure 8C:
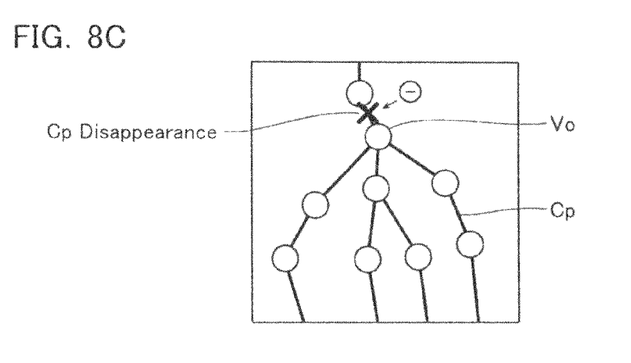
Figure 8D:
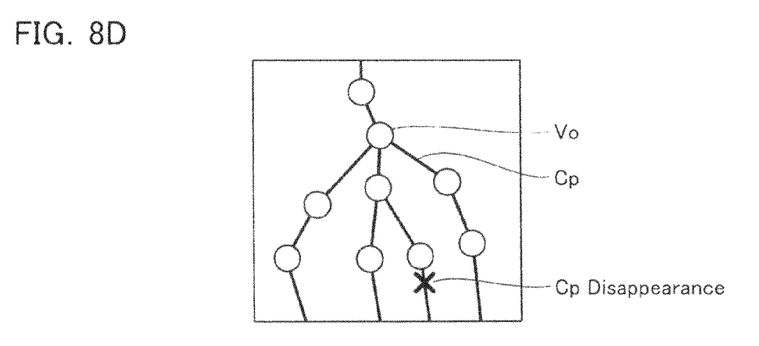

Note that at a stage immediately after manufacturing of a memory cell including the above-described kind of variable resistance element VR, said memory cell is in an initial state of being unable to undergo transition between the set state and the reset state. In order to render such an initial state memory cell MC capable of transition between the set state and the reset state, the forming operation is performed (refer to FIG. 6C). In this forming operation, a high voltage is applied to both ends of the memory cell MC whereby oxygen defects Vo and current paths Cp are formed in the variable resistance element. As a result, the memory cell MC becomes capable of transition between the set state and the reset state.

Migration of oxygen ions OI with respect to oxygen defects Vo results in oxygen defects Vo in the variable resistance element VR increasing/decreasing, whereby the resistance value of the memory cell MC changes. However, sometimes, immediately after a write pulse application operation for a write operation, a positive/negative charge (hole or electron) is trapped in the oxygen defect Vo, whereby substantively the current path Cp disappears and the resistance value of the memory cell changes, even when there is no migration of oxygen ions OI. For example, as shown in FIGS. 7A to 7D, when a positive charge (hole) is trapped in the oxygen defect Vo, a current path Cp in a vicinity thereof may disappear. Moreover, as shown in FIGS. 8A to 8D, a similar phenomenon may occur also in the case where a negative charge (electron) is trapped in the oxygen defect Vo. In addition, differences in amount, position, and so on, of the charge trapped in the oxygen defect Vo in the above-described manner may lead to an increase in variation of the resistance value of the memory cell MC. Note that the current path Cp is more easily eliminated in a memory cell whose defect region DR is large compared to in a memory cell whose defect region DR is small.

Accordingly, in the present embodiment, a rewrite operation (setting operation and resetting operation) and a read operation of the memory cell MC are executed as shown in FIGS. 9 to 12. Specifically, a voltage Vsv applied to the memory cell MC in a verify read operation in the setting operation and the resetting operation is set smaller than a read voltage Vr=Vread applied to the memory cell MC in the subsequent read operation. As an example, the voltage Vsv is about 0.3 to 0.5 V, whereas the voltage Vread is set to a voltage which is about 0.2 to 0.3 V larger than that voltage Vsv.

Figure 9:
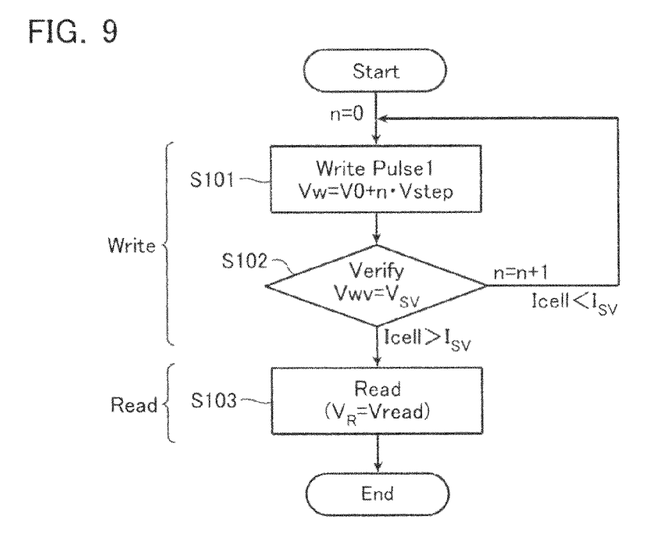
FIG. 9 is a flowchart for explaining a setting operation and a read operation according to the first embodiment.
Figure 10:
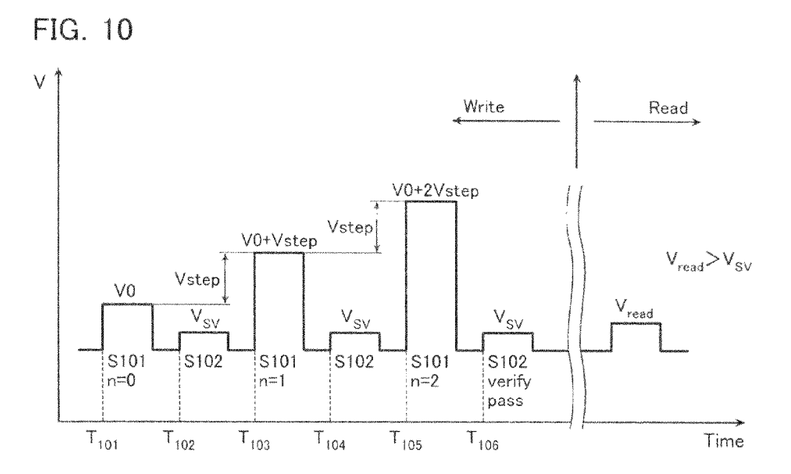
FIG. 10 is a timing chart for explaining the setting operation and the read operation according to the first embodiment.
Figure 11:
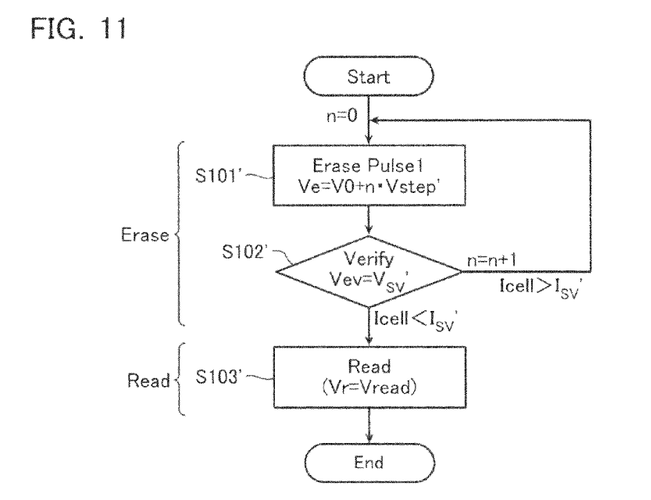
FIG. 11 is a flowchart for explaining a resetting operation and a read operation according to the first embodiment.
Figure 12:
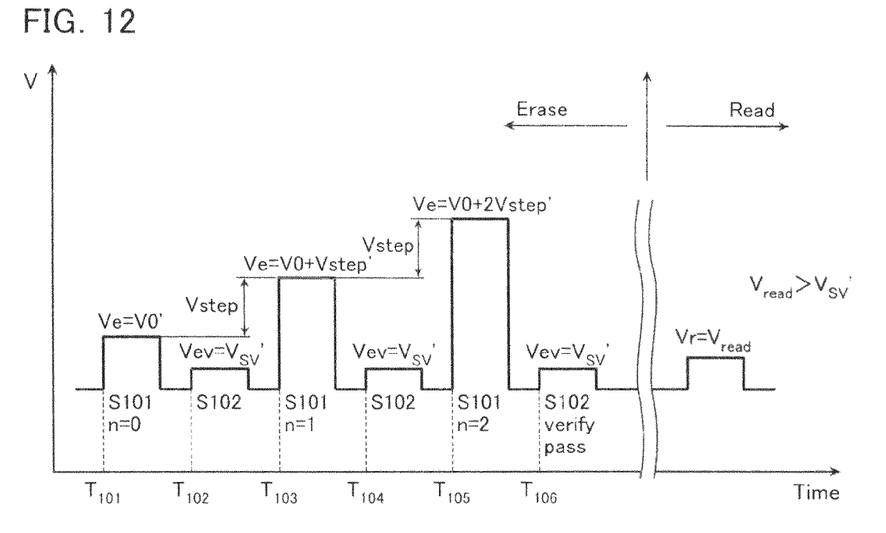
FIG. 12 is a timing chart for explaining the resetting operation and the read operation according to the first embodiment.

FIGS. 9 and 10 are respectively a flowchart and a timing chart in the case of performing the setting operation and then performing the read operation. FIGS. 11 and 12 are respectively a flowchart and a timing chart in the case of performing the resetting operation and then performing the read operation.

First, the case of performing the setting operation and then performing the read operation will be described with reference to FIGS. 9 and 10.

As shown in FIG. 9, in the setting operation according to the present embodiment, a pulse voltage application step S101 and a verify read step S102 are performed repeatedly until the setting operation is determined to have been completed.

In the pulse voltage application step S101, a pulse voltage of a magnitude of Vw=V0+n·Vstep acting as a setting voltage Vw is applied to a selected memory cell MC, thereby changing the resistance value of the variable resistance element VR from the high-resistance state to the low-resistance state. Now, the voltage V0 is an initial value of the setting voltage Vw, the step voltage Vstep is an increase width of the setting voltage Vw, and n is an integer expressing the number of times that the pulse voltage application step S101 has been performed. That is, every time the number of times n of repetitions of the pulse voltage application step S101 increases, a value of the setting voltage Vw increases by an amount of the step voltage Vstep. Note that FIG. 10 illustrates the case where steps S101 and S102 are repeated three times.

After completion of the pulse voltage application step S101, the verify read step S102 is performed. In the verify read step S102, a verify read voltage Vwv is applied to the memory cell MC to determine whether the setting operation has been completed or not. A value Vsv of this verify read voltage Vwv is, for example, about 0.3 to 0.5 V, that is, is smaller than the previously mentioned voltage Vw. The cell current Icell flowing in the memory cell MC in a state of being applied with this verify read voltage Vwv=Vsv is compared with a threshold current Isv. If the cell current Icell is smaller than a first threshold current Isv, then the selected memory cell MC is determined not to have passed the verify read step S102. In this case, n is increased by an amount of 1, and the pulse voltage application step S101 is performed again.

On the other hand, if the cell current Icell is larger than the first threshold current Isv, then the selected memory cell MC is determined to have passed the verify read step S102. In this case, the setting operation finishes.

After completion of the setting operation, the read operation is executed on that memory cell MC, based on a read command from external (step S103). In this case, the memory cell MC is applied with the read voltage Vr=Vread. This voltage Vread is set to a value which is about 0.2 to 0.3 V larger than that of the previously mentioned voltage Vsv, that is, to about 0.5 to 0.7 V, for example (Vread>Vsv). The reason for this will be mentioned later.

FIGS. 11 and 12 describe the case of performing the resetting operation and then performing the read operation. As shown in FIG. 11, in the resetting operation according to the present embodiment, a pulse voltage application step S101' and a verify read step S102' are performed repeatedly until the resetting operation is determined to have been completed.

In the pulse voltage application step S101', Ve=V0'+n·Vstep' acting as a resetting voltage Ve is applied to the selected memory cell MC, thereby changing the resistance value of the variable resistance element VR from the low-resistance state to the high-resistance state. Now, the voltage V0' is an initial value of the resetting voltage Ve, the step voltage Vstep' is an increase width of the resetting voltage Ve, and n is an integer expressing the number of times that the pulse voltage application step S101' has been performed. That is, every time the number of times n of repetitions of the pulse voltage application step S101' increases, a value of the resetting voltage Ve increases by an amount of the step voltage Vstep'. Note that FIG. 12 illustrates the case where steps S101' and S102' are repeated three times.

After completion of the pulse voltage application step S101', the verify read step S102' is performed. In the verify read step S102', a verify read voltage Vev is applied to the memory cell MC to determine whether the resetting operation has been completed or not. A value Vsv' of this verify read voltage Vev is, for example, about 0.3 to 0.5 V, that is, is smaller than the previously mentioned voltage Ve. The cell current Icell flowing in the memory cell MC in a state of being applied with this verify read voltage Vev=Vsv' is compared with a threshold current Isv'. If the cell current Icell is larger than a first threshold current Isv', then the selected memory cell MC is determined not to have passed the verify read step S102'. In this case, n is increased by an amount of 1, and the pulse voltage application step S101' is performed again.

On the other hand, if the cell current Icell is smaller than the first threshold current Isv', then the selected memory cell MC is determined to have passed the verify read step S102'. In this case, the resetting operation finishes.

After completion of the resetting operation, the read operation is executed on that memory cell MC, based on a read command from external (step S103'). In this case, the memory cell MC is applied with the read voltage Vr=Vread. This voltage Vread is set to a value which is larger than that of the previously mentioned voltage Vsv' (Vread>Vsv'). The reason for this will be mentioned later.

The reason for setting relationships of Vread>Vsv and Vread>Vsv' will be described below.

Figure 13:
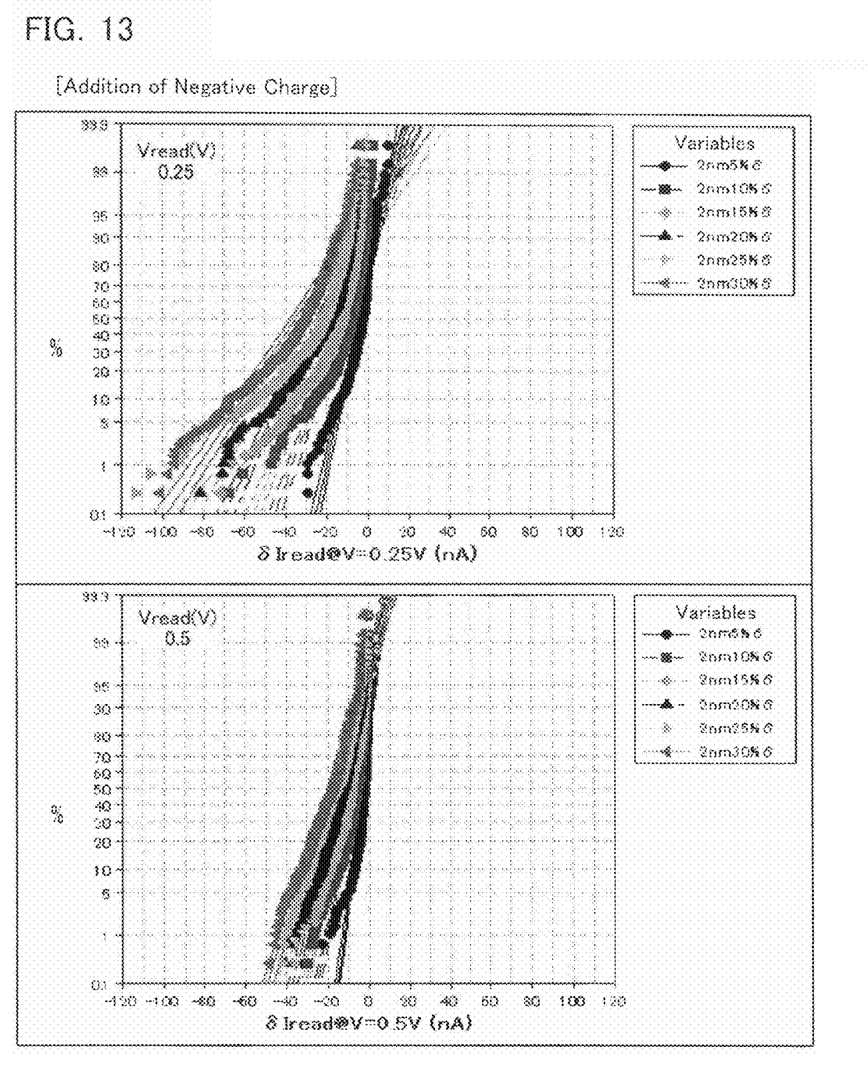
FIG. 13 is a graph showing variation in cell current Icell in the case of applying a voltage Vread to the memory cell during the read operation, in a state where a negative charge is trapped in the variable resistance element VR.
Figure 14:
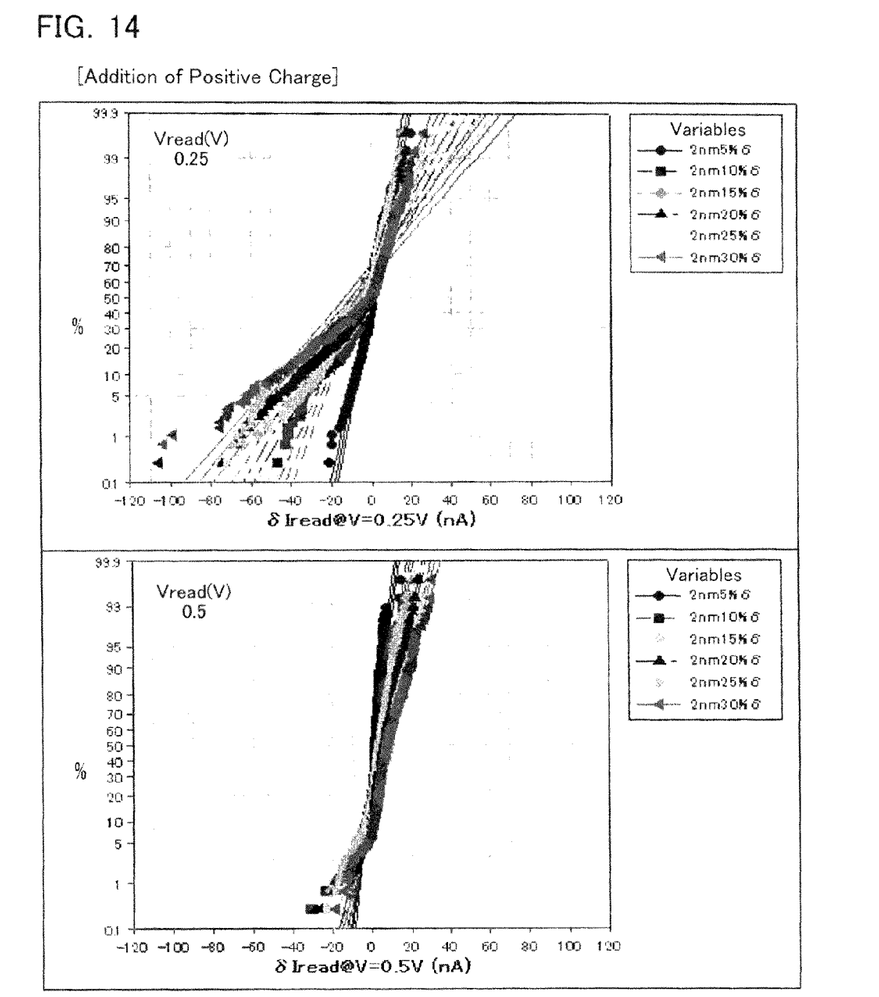
FIG. 14 is a graph showing variation in cell current Icell in the case of applying a voltage Vread to the memory cell during the read operation, in a state where a positive charge is trapped in the variable resistance element VR.

FIGS. 13 and 14 are graphs for explaining the reason for setting to Vread>Vsv and Vread>Vsv'. FIG. 13 is a graph showing distribution of the cell current Icell flowing in the memory cell MC during the read operation in the case that a negative charge (electron) is trapped in the oxygen defect in the variable resistance element VR. In FIG. 13, the upper graph shows distribution of the cell current when the applied voltage Vread during the read operation is 0.25 V. Moreover, the lower graph shows distribution of the cell current when the voltage Vread is 0.5 V. The upper graph and the lower graph respectively show graphs that differ in magnitude of density of oxygen defects Vo. FIG. 14 is a graph showing distribution of the cell current Icell flowing in the memory cell MC during the read operation in the case that a positive charge (hole) is trapped in the oxygen defect in the variable resistance element VR.

As is clear from FIGS. 13 and 14, when the voltage applied for read to the memory cell MC is large, variation in the cell current Icell appears small. This is because the larger the applied voltage, the smaller becomes the effect of trapped charge of the above-mentioned kind. Viewed from an opposite perspective, this means that if variation of the cell current Icell is small with a small read voltage, then with a larger read voltage, variation of the cell current Icell will appear even smaller. Therefore, in the present embodiment, the voltage Vsv applied to the memory cell MC in the verify read operation is set smaller than the voltage Vread applied to the memory cell MC in the read operation. Setting in such a way makes it possible for a memory cell MC determined to have passed the verify read operations (S102 and S102') by the small voltages Vsv and Vsv' to secure a sufficient read margin under the voltage Vread which is larger than this voltage Vsv. This is the reason why relationships of Vread>Vsv and Vread>Vsv' are set by the present embodiment.

Figure 15:
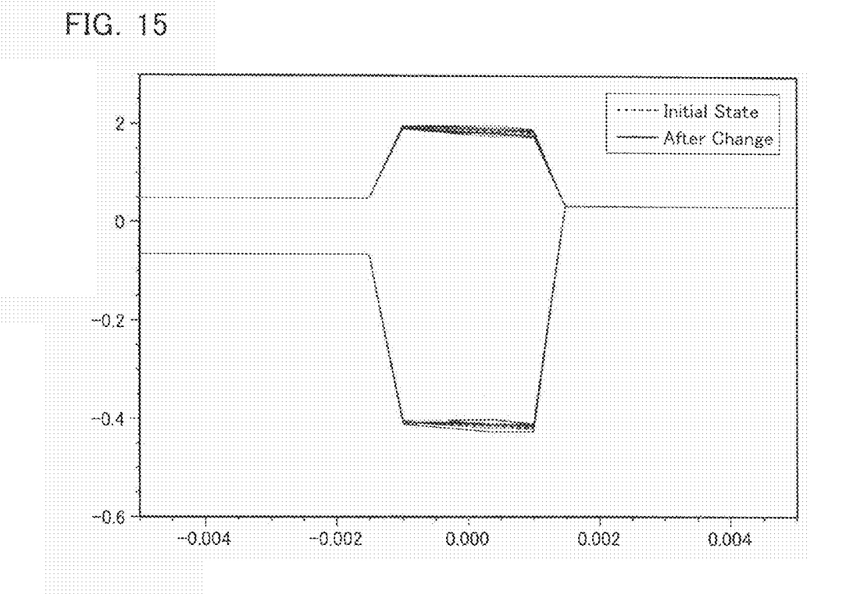
FIGS. 15 and 16 explain a reason for setting Vread>Vsv and Vread>Vsv' from a viewpoint of band structure.
Figure 16:
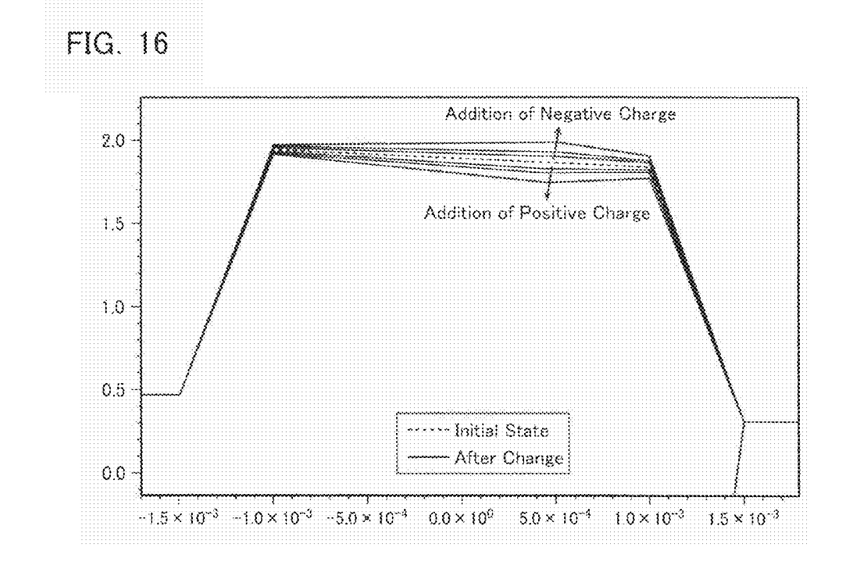

FIGS. 15 and 16 explain the reason for setting Vread>Vsv and Vread>Vsv' from a viewpoint of band structure. FIG. 15 is a band diagram of a vicinity of the variable resistance element VR of the memory cell MC when a voltage applied to the memory cell MC is 0.25 V; and FIG. 16 is an enlarged view thereof. When a charge is trapped in the oxygen defect Vo in the vicinity of the variable resistance element VR, a distortion occurs in the band diagram and a change occurs also in ease-of-flow of the charge. On the other hand, when the voltage applied to the memory cell MC increases, a change in the band diagram due to that change in voltage is (comparatively) larger, and an effect due to trapped charge is small.

Thus, the effect due to trapped charge is large when the applied voltage to the memory cell MC is small, and is small when the applied voltage to the memory cell MC is large. The reason for setting Vread>Vsv and Vread>Vsv' may be understood also from these FIGS. 15 and 16.

Note that the above-described embodiment was described assuming the voltages Vsv and Vsv' and the voltage Vread to each be a fixed value, but it is also possible to configure the voltage Vsv, the voltage Vsv', and the voltage Vread to be variable. For example, these voltage values may be configured to increase as the number of times n of repetitions increases. However, even in that case, relationships of Vread>Vsv and Vread>Vsv' must be maintained.

[Advantages]

As described above, according to the present embodiment, the voltage applied to the memory cell in the verify read operation in the rewrite operation (setting operation or resetting operation) is set to a value which is smaller than that of the voltage applied to the memory cell in the read operation. As a result, the read margin of the memory cell can be increased.

Second Embodiment

Next, a second embodiment will be described with reference to FIGS. 17 and 18. In this embodiment, a configuration of the memory cell array 11 differs from that in the first embodiment. Specifically, the memory cell array of this second embodiment differs from that of the first embodiment in having a structure comprising bit lines that extend in a direction perpendicular to the substrate. That is, the word lines WL are arranged in plurality with a certain pitch in the direction perpendicular to the substrate and extend having a direction parallel to the substrate as a longer direction. Furthermore, the bit lines BL are arranged in plurality with a certain pitch in a direction parallel to the substrate and extend having the perpendicular direction as a longer direction.

Figure 17:
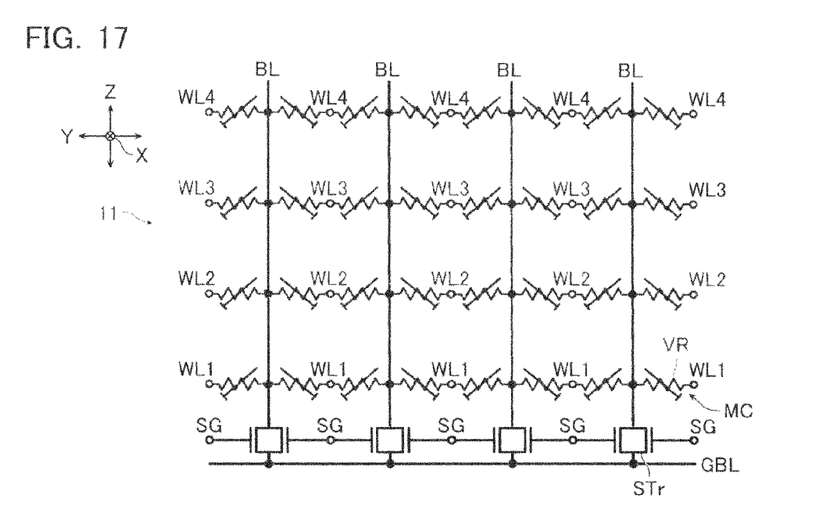
FIG. 17 is an example of a circuit diagram of a memory cell array 11 according to a second embodiment.

FIG. 17 is an example of a circuit diagram of the memory cell array 11 according to the present embodiment. FIG. 18 is an example of a perspective view showing a stacked structure of the memory cell array 11. Note that in FIGS. 17 and 18, an X direction, a Y direction, and a Z direction intersect each other, and the X direction is a direction perpendicular to a plane of paper. Moreover, the structure shown in FIG. 17 is provided repeatedly in the X direction. Furthermore, in the description below, portions similar to those of the first embodiment are assigned with identical symbols to those assigned in the first embodiment, and descriptions thereof will be omitted. Note that the rewrite operation (setting operation and resetting operation) and the subsequent read operation are similar to those of the first embodiment, hence descriptions thereof will be omitted.

As shown in FIG. 17, the memory cell array 11 includes a select transistor STr, a global bit line GBL, and a select gate line SG, in addition to the above-mentioned word line WL, bit line BL, and memory cell MC.

Figure 18:
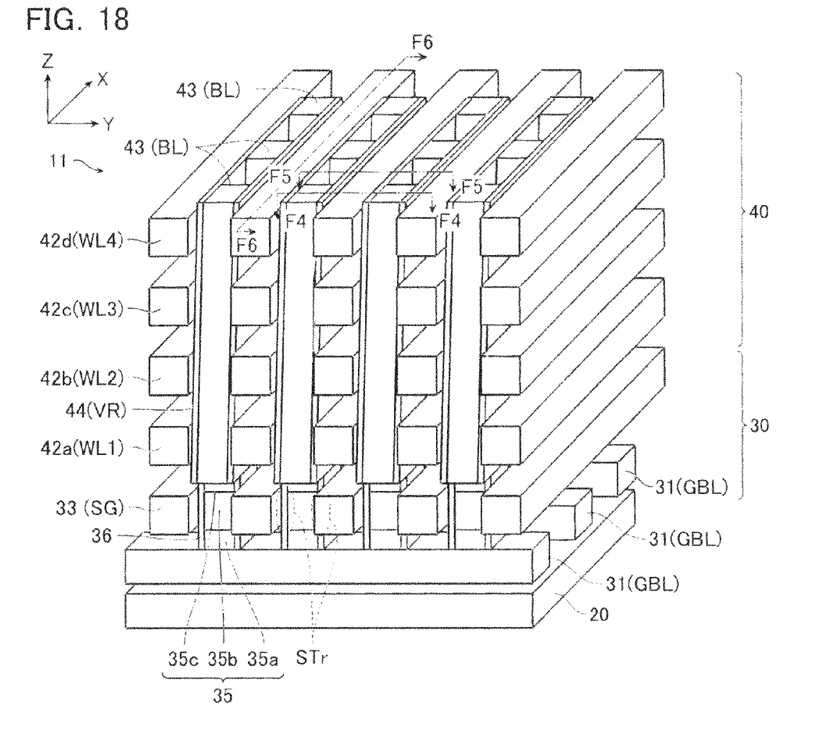
FIG. 18 is an example of a perspective view showing a stacked structure of the memory cell array 11.

As shown in FIGS. 17 and 18, word lines WL1 to WL4 are arranged in the Z direction with a certain pitch, and extend in the X direction. The bit lines BL are arranged in a matrix in the X direction and the Y direction, and extend in the Z direction. The memory cell MC is disposed at places where these word lines WL and bit lines BL intersect. Therefore, the memory cells MC are arranged in a three-dimensional matrix in the X, Y, and Z directions.

As shown in FIG. 17, the memory cell MC includes the variable resistance element VR. As described with reference to FIG. 4, the variable resistance element VR includes a metal oxide layer.

As shown in FIG. 17, the select transistor STr is provided between the global bit line GBL and one end of the bit line BL. The global bit lines GBL are aligned with a certain pitch in the X direction, and extend in the Y direction. One global bit line GBL is commonly connected to one ends of a plurality of the select transistors STr arranged in a line in the Y direction.

Moreover, gate electrodes disposed between two select transistors STr arranged adjacently in the Y direction can be commonly connected. The select gate lines SG are aligned with a certain pitch in the Y direction, and extend in the X direction. One select gate line SG is commonly connected to gates of a plurality of the select transistors STr arranged in a line in the X direction. Note that it is also possible for the gate electrodes between two select transistors STr arranged adjacently in the Y direction to be separated, and for the two select transistors STr to each be operated independently.

[Others]

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A nonvolatile semiconductor memory device, comprising:
    a memory cell array; and
    a control circuit that controls a voltage applied to the memory cell array,
    the memory cell array comprising:
    a first wiring line;
    a second wiring line that intersects the first wiring line; and
    a memory cell disposed at an intersection of the first and second wiring lines and including a variable resistance element,
    the control circuit being configured to, in a rewrite operation of the memory cell, repeatedly perform a pulse application operation and a verify read operation, the pulse application operation applying a pulse voltage to the memory cell, and the verify read operation applying a first voltage to the memory cell to determine whether the rewrite operation has been completed or not,
    the control circuit being configured to, in a read operation from the memory cell, apply a second voltage to the memory cell, and
    the second voltage having a voltage value which is larger than that of the first voltage.

2. The nonvolatile semiconductor memory device according to claim 1, wherein
    the variable resistance element includes a metal oxide.

3. The nonvolatile semiconductor memory device according to claim 2, wherein
    the variable resistance element comprises a defect region that includes an oxygen defect.

4. The nonvolatile semiconductor memory device according to claim 1, wherein
    the control circuit, in the rewrite operation, repeatedly performs the pulse application operation and the verify read operation while gradually increasing a magnitude of the pulse voltage.

5. The nonvolatile semiconductor memory device according to claim 4, wherein
    the variable resistance element includes a metal oxide.

6. The nonvolatile semiconductor memory device according to claim 5, wherein
    the variable resistance element comprises a defect region that includes an oxygen defect.

7. The nonvolatile semiconductor memory device according to claim 1, wherein
    a plurality of the first wiring lines are arranged with a certain pitch in a first direction perpendicular to a substrate and extend in a second direction parallel to the substrate, and
    a plurality of the second wiring lines are arranged with a certain pitch in the second direction and extend in the first direction.

8. The nonvolatile semiconductor memory device according to claim 7, wherein
    the variable resistance element includes a metal oxide.

9. The nonvolatile semiconductor memory device according to claim 8, wherein
    the variable resistance element comprises a defect region that includes an oxygen defect.

10. A method of controlling a nonvolatile semiconductor memory device,
    the nonvolatile semiconductor memory device comprising a memory cell array and a control circuit that controls a voltage applied to the memory cell array, and
    the memory cell array comprising a first wiring line, a second wiring line that intersects the first wiring line, and a memory cell disposed at an intersection of the first and second wiring lines and including a variable resistance element,
    the method comprising:
    in a rewrite operation of the memory cell, repeatedly performing a pulse application operation and a verify read operation, the pulse application operation applying a pulse voltage to the memory cell, and the verify read operation applying a first voltage to the memory cell to determine whether the rewrite operation has been completed or not; and
    in a read operation from the memory cell, applying a second voltage to the memory cell,
    the second voltage having a voltage value which is larger than that of the first voltage.

11. The method according to claim 10, wherein
    the variable resistance element includes a metal oxide.

12. The method according to claim 11, wherein
    the variable resistance element comprises a defect region that includes an oxygen defect.

13. The method according to claim 10, wherein
    in the rewrite operation, the pulse application operation and the verify read operation are repeatedly performed while gradually increasing a magnitude of the pulse voltage.

* * * * *